(12) United States Patent
Budd et al.

(10) Patent No.: US 8,755,644 B2
(45) Date of Patent: Jun. 17, 2014

(54) SILICON BASED OPTICAL VIAS

(75) Inventors: Russell A. Budd, North Salem, NY (US); Punit P. Chiniwalla, New York, NY (US); Chirag S. Patel, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/080,266

(22) Filed: Apr. 1, 2008

(65) Prior Publication Data

US 2010/0322551 A1 Dec. 23, 2010

Related U.S. Application Data

(62) Division of application No. 10/675,139, filed on Sep. 30, 2003, now Pat. No. 7,352,066.

(51) Int. Cl.
*G02B 6/12* (2006.01)
*H01L 21/00* (2006.01)
*H01L 23/48* (2006.01)

(52) U.S. Cl.
USPC ................................. 385/14; 257/774; 438/31

(58) Field of Classification Search
USPC ................................. 385/14; 257/774; 438/31
See application file for complete search history.

(56) References Cited

U.S. PATENT DOCUMENTS 6,777,715 B1 * 8/2004 Geusic et al. ................. 257/80

FOREIGN PATENT DOCUMENTS

WO   WO 2005031417 A1 *   4/2005   ................. 385/14

* cited by examiner

*Primary Examiner* — Jerry Blevins
(74) *Attorney, Agent, or Firm* — Thomas A. Beck; Daniel P. Morris

(57) ABSTRACT

Method of fabricating a semiconductor die with a microlens associated therewith. More particularly, a method for fabricating a vertical channel guide optical via through a silicon substrate wherein the optical via can contain lens elements, a discrete index gradient guiding pillar and other embodiments. Also disclosed are means for transferring, coupling and or focusing light from an electronic-optical device on the top of a semiconductor substrate through the substrate to a waveguiding medium below the substrate. The high alignment accuracies afforded by standard semiconductor fabrication processes are exploited so as to obviate the need for active alignment of the optical coupling or light guiding elements.

44 Claims, 15 Drawing Sheets

FIG.2b1

FIG.4a
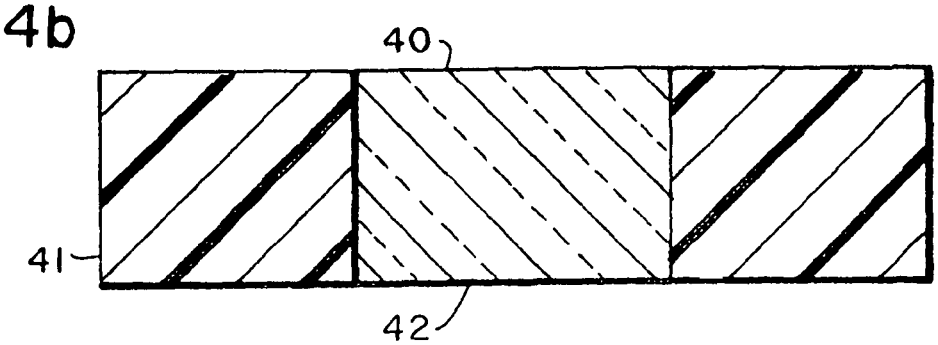
FIG.4b
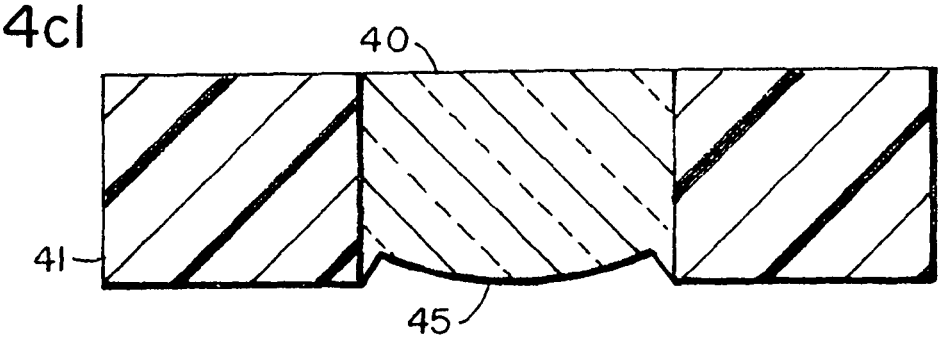
FIG.4c1
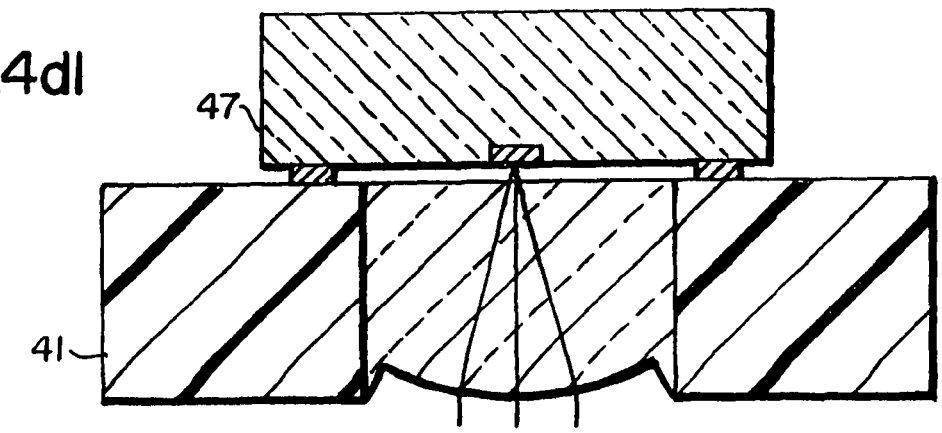
FIG.4d1

SILICON BASED OPTICAL VIAS

This application is a divisional application of U.S. Non-Provisional application Ser. No. 10/675,139, filed Sep. 30, 2003, which issued as U.S. Pat. No. 7,352,066, and claims the benefit of priority pursuant to 35 U.S.C. §120.

FIELD OF THE INVENTION

The present invention relates to a method of fabricating a semiconductor die with a microlens associated therewith. More particularly, the present invention relates to a method for fabricating a vertical channel guide optical via through a silicon substrate wherein the optical via can contain lens elements, a discrete index gradient guiding pillar and other embodiments.

BACKGROUND OF THE INVENTION

Optoelectronic systems used for optically communicating between device's typically consist of a driver, an optical light emitting device such as a VCSEL, light coupling elements such as mirrors, gratings and optical waveguides for transporting optical signals from one point to another. An assembly of such optoelectronic system comprises fabricating waveguides and coupling elements on top of a substrate such as a printed wiring board (PWB) and then attaching a VCSEL device on top of such a substrate. The optical light emitted from the VCSEL is coupled into a waveguide on the substrate and is guided in-plane from one side of the substrate to other devices. It is very difficult and often impractical to integrate all of the components of the optoelectronic system such as driver and VCSEL onto a PWB substrate especially when the operating frequencies are beyond the GHz range. An alternate substrate such as silicon eases many of the integration complexities and provides a very high speed solution. A high performance computing system can be created by compactly integrating high speed driver and VCSEL components on a silicon substrate and maintaining optical communication through wave guides on the PWB. This scheme requires being able to couple light from one side of the silicon substrate to the other so that it can be coupled to a waveguide on the PWB.

The present invention enables crucial integration of optical and electronic components on a single substrate that is needed for inter chip optical communication through a backplane. This is done by being able to effectively couple light (used for optical communication) from sources mounted on one side of the substrate to waveguiding elements that may be located on the other side of the same substrate or a completely independent substrate.

SUMMARY OF THE INVENTION

The object of the present invention is to provide a means of transferring, coupling and or focusing light from an EO device on the top of a semiconductor substrate through the substrate to a waveguiding medium below the substrate.

It is understood that the same elements may also be used to transfer or couple from the waveguiding medium below the semiconductor substrate up through the substrate to a photodiode on top for detection and conversion into electrical signals. Additionally, the same elements described may be used to transfer or couple light from a waveguiding medium at one surface of the substrate to another waveguiding medium on the opposite side of the substrate.

It is an object of this invention that the high alignment accuracies afforded by standard semiconductor fabrication processes are exploited such to obviate the need for active alignment of the optical coupling or light guiding elements.

BRIEF DESCRIPTION OF THE DRAWINGS

FIGS. 4a-4d.2 are sectional side views of an embodiment showing process steps to fabricate vertical channel guide optical via with directing elements on the backside;

DETAILED DESCRIPTION OF THE PREFERRED EMBODIMENT

Figure 1A:
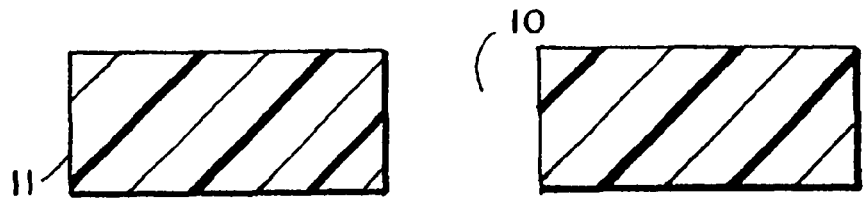
FIGS. 1a-1d are sectional side views of an embodiment showing process steps to fabricate vertical channel guide optical via.

Referring to the drawings more particularly by reference numbers, sectional side views of process steps sequence to fabricate vertical channel guide optical via are shown in FIGS. 1a-1e. A via 10 may be formed by known processes in a silicon substrate 11 as shown in FIG. 1a.

While the examples herein disclose silicon as the substrate, other elements/compounds can conveniently form the substrate. For example, in addition to silicon, germanium, indium phosphide, silicon/germanium, gallium arsenide, glass, quartz, sapphire and silicon carbide can be used to form the substrate.

Figure 1B:
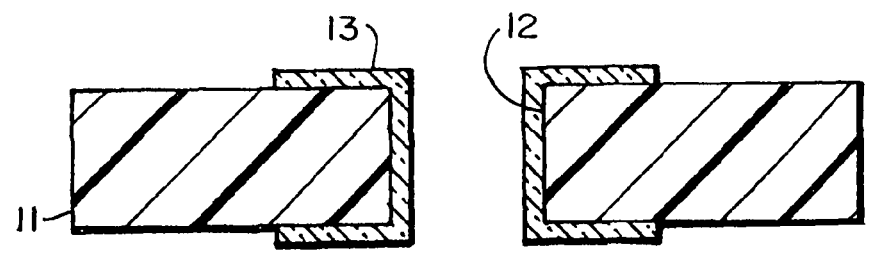
Figure 1C:
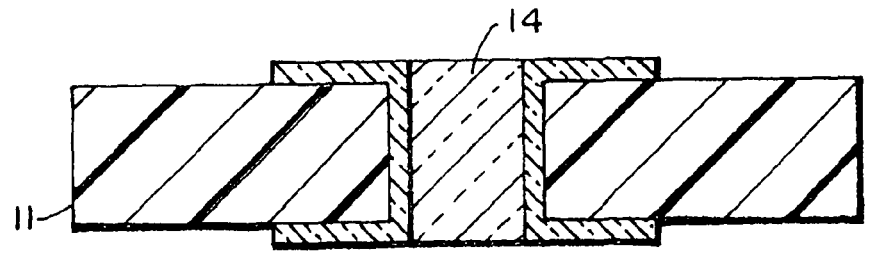

The thru via 10 shown in FIG. 1a may be formed by first partially etching it in the silicon substrate 11 to the desired depth and later grinding silicon from the backside. Alternatively, the thru via 10 may be formed by completely etching it in the silicon substrate 11. The sidewall 12 of via 10 may be covered with low refractive index material to provide the function of a cladding layer 13 as shown in FIG. 1b. Via 10 with low refractive index material on its sidewall 12 may be filled partially or completely with high refractive index material 14 to provide the function of a core layer as shown in FIG. 1c. Suitable materials having a low refractive index which can be used in accordance with the various embodiments of the present invention are silicon dioxide or a polymer selected from the group consisting of acrylate polymers, siloxane polymers and vapor deposited polymers. Suitable materials having a high refractive index which can be used in accordance with the various embodiments of the present invention are: silicon dioxide or a polymer selected from the group consisting of acrylate polymers, siloxane polymers and vapor deposited polymers.

The terms "low" and "high" are used to describe the relative index of refraction of material. When a low index of refraction material is adjacent to a relatively high index of refraction material, light approaching the interface from the higher index material side intersecting the interface under the critical angle is internally reflected as defined by Snell's Law. Thus for a ray of light refracted at a surface separating two media, the ratio of the sine of the angle of incidence to the sine of the angle of refraction is constant and is known as the angle of refraction for the two media. In this way, light is guided within "high" index of refraction materials when surrounded by relatively "low" index materials. The "core" of light guiding elements is therefore selected to be formed from materials possessing a high index of refraction, while the "clad", or surrounding materials, are selected to be low index of refraction materials. In the present invention it happens that the core and the clad materials can be identical; i.e., silicon dioxide or a polymer selected from the group consisting of acrylate polymers, siloxane polymers and vapor deposited polymers.

The emphasis is not on the material per se, but rather the index of refraction possessed by the two materials which are adjacent to each other in the system. In the present invention, the index difference ($\Delta_n$) between high and low index of refraction material can vary between about 0.01 and about 2, depending on specific system design. For example, a high index core material may have a refractive index of 2, whereas the complimentary low index material may have a refractive index of 1.5.

Figure 1D:
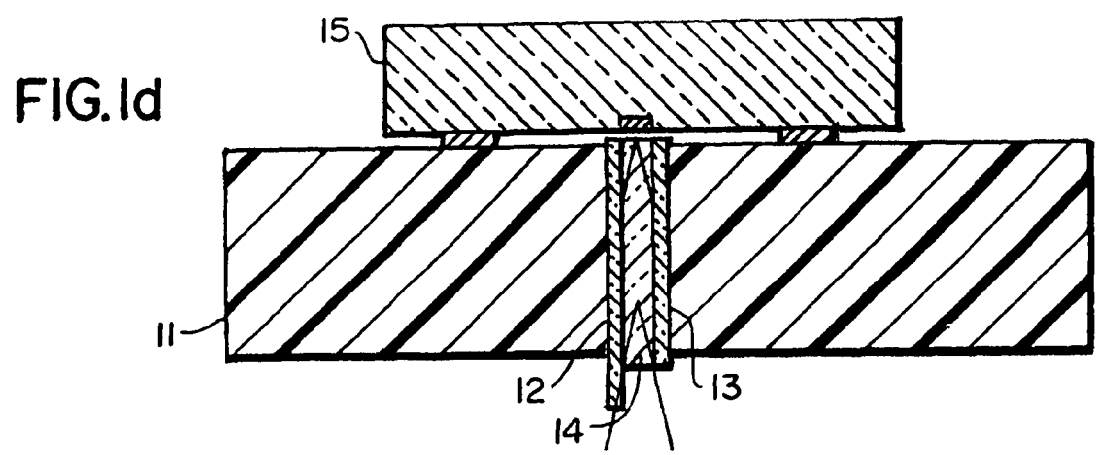

An optical communication device 15 is aligned with the via, and is attached on top of the vertical guide optical via as shown in FIG. 1d. This embodiment may be employed when it is desired to guide or couple optical signal from one side of silicon substrate to the other by using a core/clad vertical waveguide structure. In this embodiment, an object is to maintain the spot size through the silicon substrate 11 using the difference in the index of refraction between the core layer and the clad layer.

There are light emitting and receiving elements which are aligned to the vertical optical guide. In all of the embodiments disclosed herein, the light emitting element can be a light emitting carbon nanotube, vertical cavity surface emitting laser (VCSEL), LED, edge emitting laser, external laser source, wave guiding element and optical fiber. Suitable light receiving elements are a photodetector and a photoreceiver.

Figure 2A:
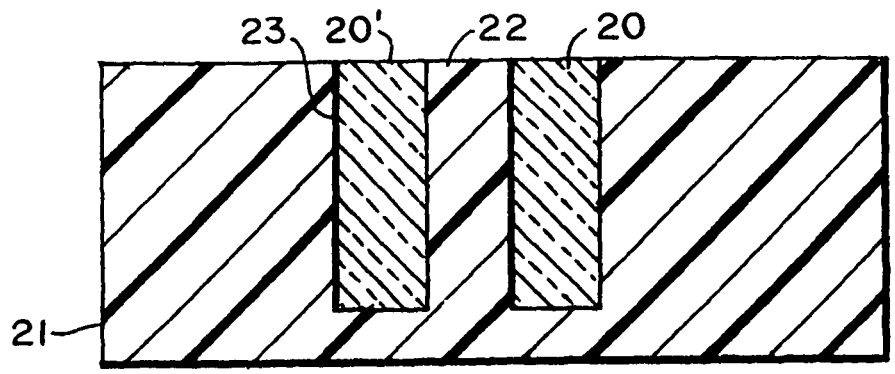
FIGS. 2a-2c are sectional side views of an alternate embodiment showing process steps to fabricate vertical channel guide optical via thru a silicon core.
Figure 2B:
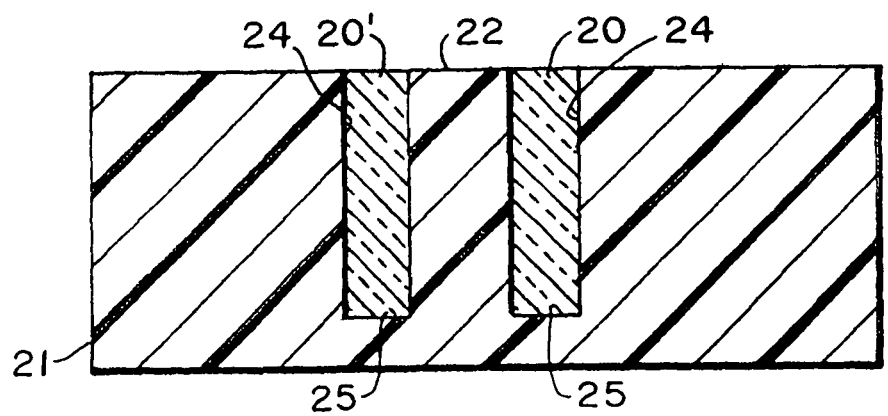
Figure 2C:
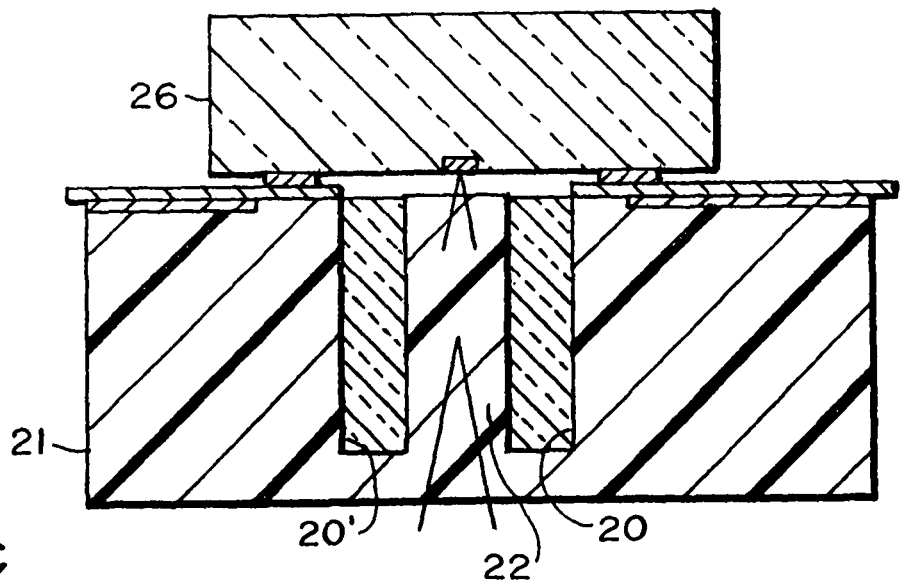

FIGS. 2a-2c are sectional side views of an alternate embodiment of the present invention showing process steps to fabricate a vertical channel guide optical via 20 thru silicon core 21. FIG. 2b1 is a top view of FIG. 2b.

Several of the embodiments of the present invention employ "annular vias." As used herein, an "annular via" refers to the volume generated when a rectangle of desired base is rotated about a vertical central axis which central axis is the diameter in the center of a "core" element.

Annular via comprising 20 and 20' may be etched in silicon 21 as shown in FIG. 2a. Annular via comprising 20 and 20' is formed to obtain the desired diameter silicon post 22 in its center surrounded by an annulus of desired dimensions. The annular via comprising 20 and 20' may be partially etched into silicon. The sidewalls 23 of the annular via comprising 20 and 20' may be covered with a low refractive index material to provide the function of a cladding layer 24 as shown in FIG. 2b. For the purpose of this embodiment, any remaining volume of the annular via may be filled with suitable optical, electrical or dielectric material, or it may be left unfilled. Typical examples of such optical materials are optically transparent polymers such as acrylates and siloxanes. Typical electrical materials are conductive copper paste, and typical dielectric materials known in the art are dielectric polymers such as epoxy polymers or polyimide.

An optical communication device 26 may be aligned and attached on top of the vertical guide optical via 20, 20' as shown in FIG. 2c. This embodiment may be employed when it is desired to guide or couple optical signal of suitable wavelength from one side of silicon substrate 21 to the other by using silicon as a core material 21. In this embodiment, light is guided with controlled divergence through substrate 21. In this embodiment, it is assumed that the light wavelength is transparent in silicon via clad with polymer or is a nitride annular ring filled with polymer using materials noted above.

Figure 3A:
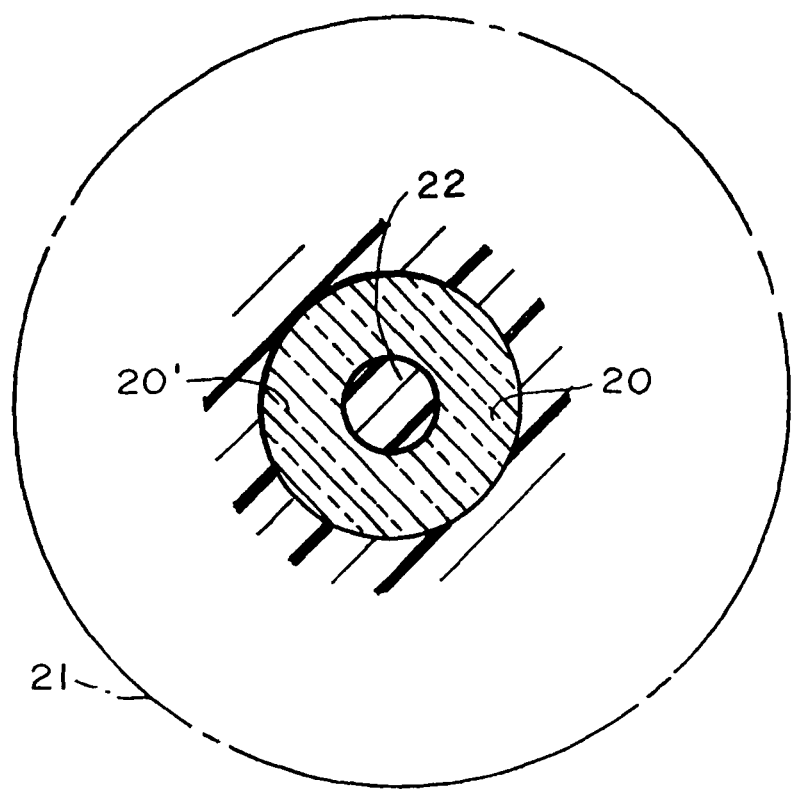
FIGS. 3a-3d are sectional side views of an alternate embodiment showing process steps to fabricate electro-optical via.
Figure 3A:
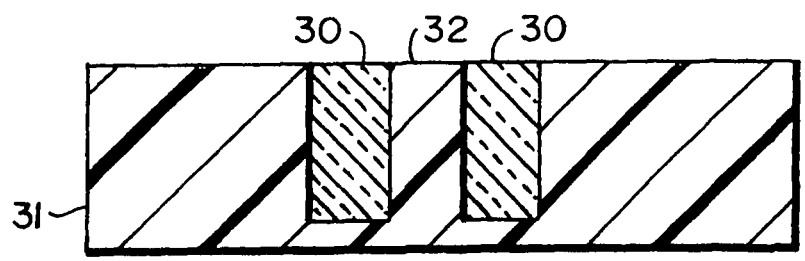
Figure 3B:
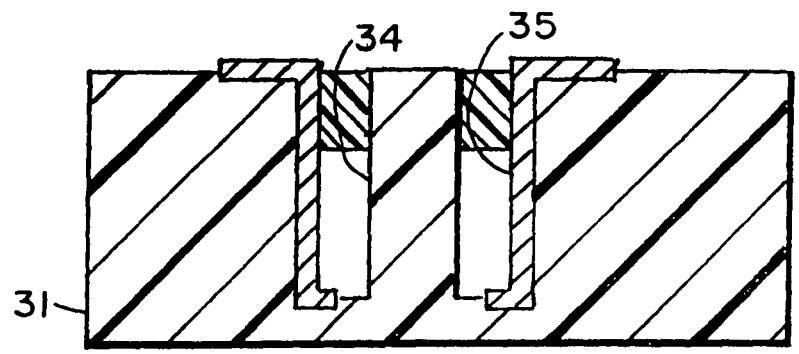

FIGS. 3a-3d are sectional side views of an alternate embodiment showing process steps to fabricate an electro-optical via. Annular via 30 is etched in silicon substrate 31 as shown in FIG. 3a. Annular via 30 is formed to obtain desired diameter silicon post 32 in its center surrounded by an annulus of desired dimensions. Annular via 30 may be partially etched into silicon 31. The sidewalls 33 of annular via 30 may be partially covered with a low refractive index material to provide the function of a waveguide cladding layer 34 as shown in FIG. 3b. Sidewalls 33 of annular via 30 may be partially covered with an electrically conductive material, as listed above to provide the function of carrying electrical signal as shown in FIG. 3b. For the purpose of this embodiment, any remaining volume of via 30 may be filled with suitable optical, electrical, or dielectric material of the type detailed above, or it may be left unfilled.

Figure 3C:
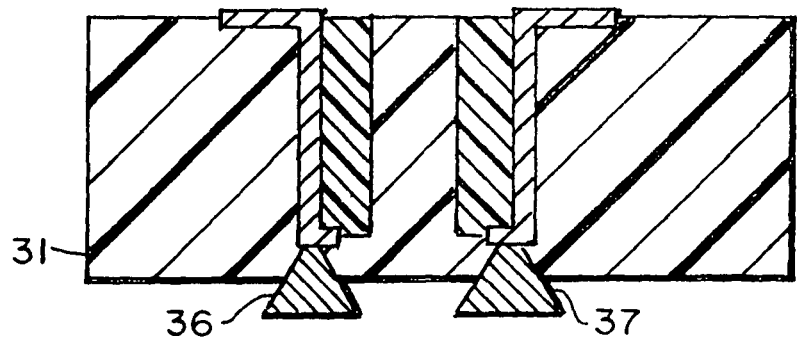

As shown in FIG. 3c, an electrical connection to deposited electrically conductive material 34 in via 30 may be formed by forming a second via 35 by etching from the backside of the silicon substrate to the deposited electrically conductive material 34. An electrically conductive material 36, such as solder is deposited from the backside of the silicon substrate to allow the complete assembly to be attached to a foreign substrate 37, such as an FR-4 board, ceramic or any other similar type of substrate with complimentary electrically conductive signal lines 38'.

Figure 3D:
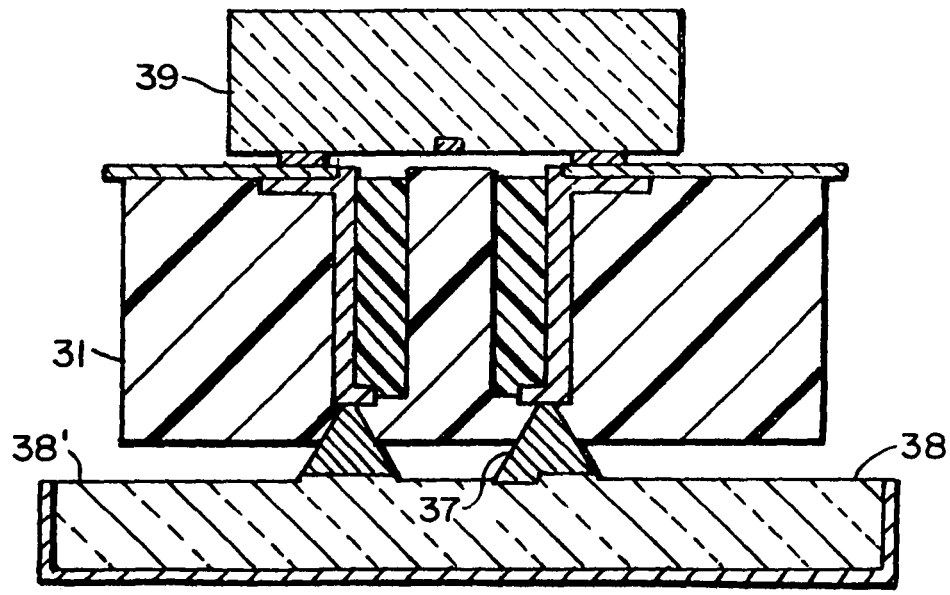

During the process of forming an electrical connection, the silicon substrate may be temporarily attached to an adhesive substrate such as commercially available sheet adhesives or other substrate. Additional photolithographic processes may be performed on the backside of silicon substrate. These processes may involve defining a pattern, etching the silicon substrate, passivating the silicon substrate backside surface, forming electrical contacts by means of depositing, plating, or screening metals or otherwise electrically conductive material 36 such as solder. An optical communication device 38 may be aligned and attached on top of electro-optical via as shown in FIG. 3d. This embodiment may be employed when it is desired to guide or couple optical signals of suitable wavelength from one side of silicon substrate to the other by using silicon as a core material. The embodiment is further employed when it is desired to establish an electrical connection from one side of silicon substrate 31 to the other through the same via.

FIGS. 4a-4d.2 are sectional side views of an alternate embodiment showing process steps to fabricate a vertical channel guide optical via 40 through silicon core 41 where the back side 42 of via 40 is patterned to introduce refractive (e.g. lens) or diffractive (e.g. grating) elements. Via 40 is formed by known processes in a silicon substrate 41 as shown in FIG. 4a. Through via 40 shown in FIG. 4a is formed by first partially etching it in silicon 41 to a desired depth and later grinding silicon from the backside 42. Through via 40 may alternatively be formed by completely etching it in silicon. In either event, through via 40 is then filled with a transparent material 43 as shown in FIG. 4b. The backside 42 of via 40 is then patterned and etched using any convenient known lithographic and etch process to form optical light directing elements 44 as shown in FIG. 4c. These elements may be refractive, such a lens 45 shown in FIG. 4c.1, or diffractive, such as a grating 46 shown in FIG. 4c.2. An optical communication device 47 may be aligned and attached on top of optical via as shown in FIG. 4d.1 and FIG. 4d.2. This embodiment involving the optical communication device may be employed when it is desired to guide or couple optical signal of suitable wavelength from one side of silicon substrate 41 to the other by unguided transmission through transparent media 43 in the silicon substrate to optical directing elements at the bottom side of optical via 40.

Figure 5A:
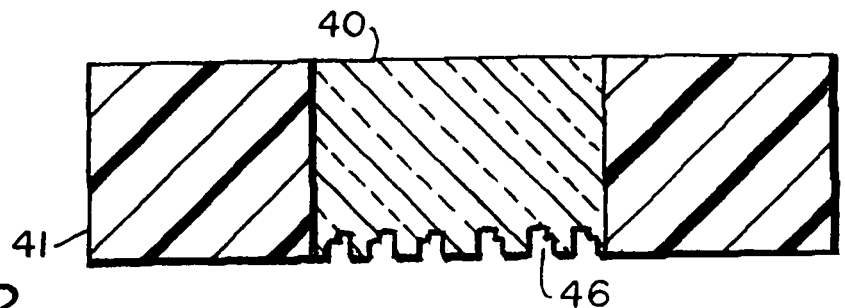
FIGS. 5a-5i are sectional side views of an alternate embodiment showing process steps to fabricate vertical channel guide optical via with lens elements.
Figure 5A:
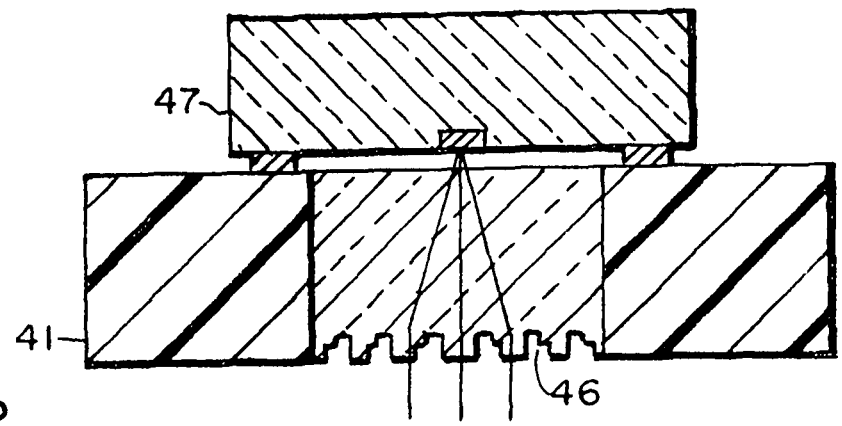
Figure 5A:
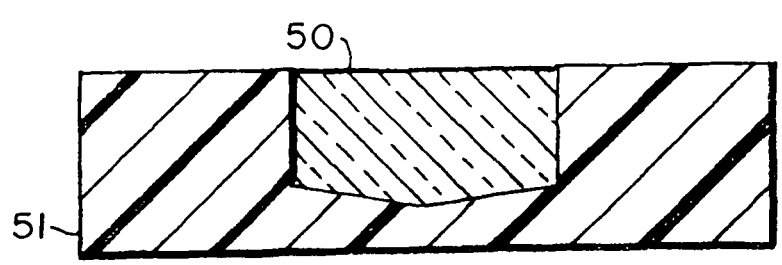
Figure 5B:
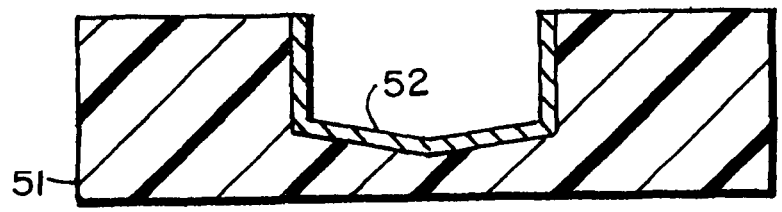

FIGS. 5a-5i are sectional side views of an embodiment showing the process steps to fabricate vertical channel guide optical via 50 through silicon substrate core 51 where a lens is incorporated into via 50. There are two processes to form such a structure shown separately in FIGS. 5a-5e and FIGS. 5f-5i. In the first of these process sequences, via 50 is formed in a silicon substrate as shown in FIG. 5a using any known process; Through via 50 shown in FIG. 5a is formed in a series of steps. First, the via is partially etched in silicon substrate 51 to desired depth using a known process. The process to form the via in question is designed to form an inherently curved surface at the bottom of the etched portion of via 50. The intent of this embodiment is to use this curved surface as a lensing element. A thin layer of etch resistant material 52 is then deposited as shown in FIG. 5b.

Figure 5C:
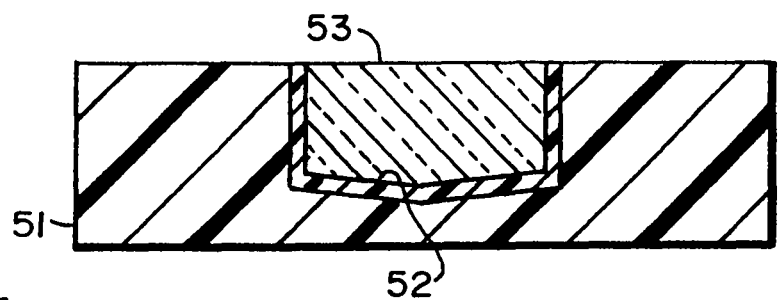
Figure 5D:
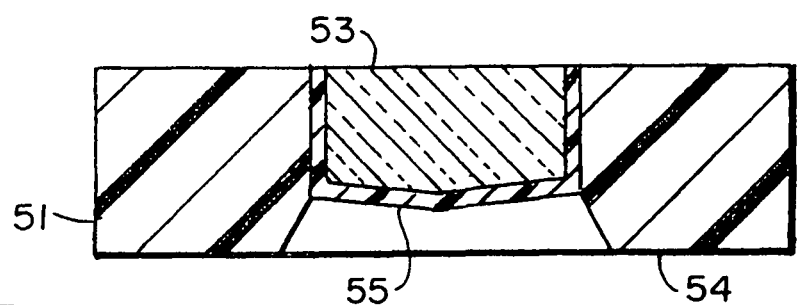

The key property of the aforementioned materials is that they are resistant to processes used to etch silicon. Many materials can be chosen for this layer 52, including polymers such as polyimide or vapor deposited polymers and inorganic layers such as silicon nitride. Etch resistant material 52 may be optically transparent as well. If this material is not optically transparent, this layer must be removed prior to use (step not shown). Preferably, a silicon nitride layer or silicon oxide layer may be used as the "etch stop" layer depending on the process used in further steps to etch the silicon. Via 50 is then filled to the surface thereof with transparent material 53 as shown in FIG. 5c. Suitable materials having low optical attenuation should be used for this purpose in accordance with the various embodiments of the present invention. Examples of such materials are acrylate or siloxane polymers.

Figure 5E:
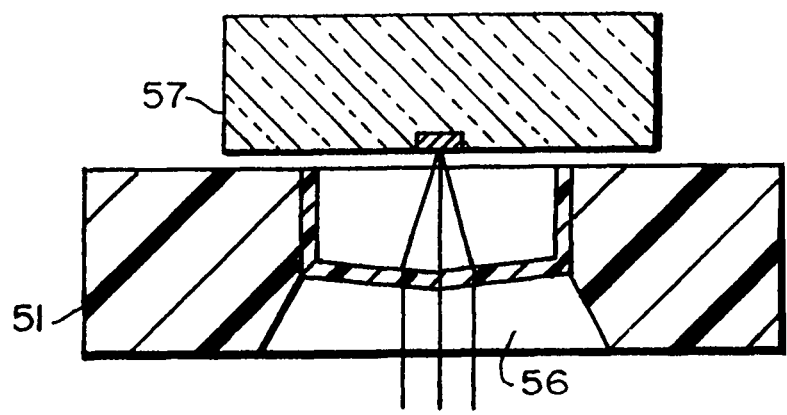

A planarization step (not shown) may be used to produce a planar surface at the top of the via, but may not be needed because of the use of an optical underfill such as a transparent epoxy. The back side 54 of silicon substrate 51 is then etched to open the bottom side 55 of via 50. This etch may be a dry etch or a wet etch, and must stop on the etch stop layer 52 on the curved surface 56 at the base of via 50 shown in FIG. 5d. An optical communication device 57 is then aligned and attached on top of the vertical guide optical via as shown in FIG. 5e.

Figure 5F:
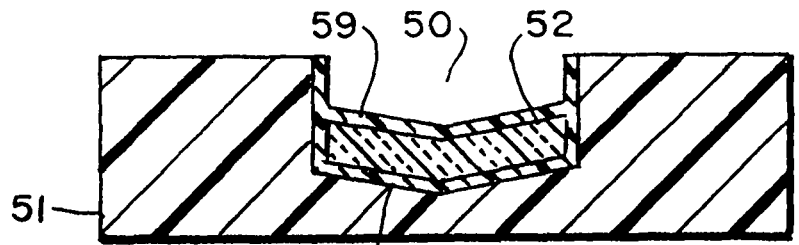

In the second of these process sequences, via 50 is formed as before by known processes in a silicon substrate core 51. Via 50 is first partially etched in the silicon substrate 51 to desired depth using a known process. A thin layer of etch resistant material 52 is then deposited. The key property of this material is that it resistant to processes used to etch silicon. A silicon nitride layer or silicon oxide layer may be used for this depending on the process used in further steps to etch silicon. These steps are shown before in FIG. 5a and FIG. 5b. If the etch process does not result in a surface at the bottom of via 50 appropriate for lensing, an alternate process may be used to form the curved surface. Via 50 is filled with a "sacrificial" material 58. This "sacrificial material" 58 possesses an appropriate surface tension that when placed in contact with etch resistant material 52, naturally forms a miniscus 59 in via 50 as shown in FIG. 5f. The curvature of miniscus 59 is regulated by controlling the surface tension of the via wall 50 and the surface tension of sacrificial material 58. A second thin layer of etch resistant material 520 is then deposited. The key property of material 520 is that it resistant to processes used to remove sacrificial layer 58 and may or may not be the same etch material as first etch resistant layer 52. The etch resistant material 520 may be optically transparent as well. If this material is not optically transparent, this layer must be removed prior to use (step not shown). Via 50 is then filled to the surface of the via with a transparent material 53.

Figure 5G:
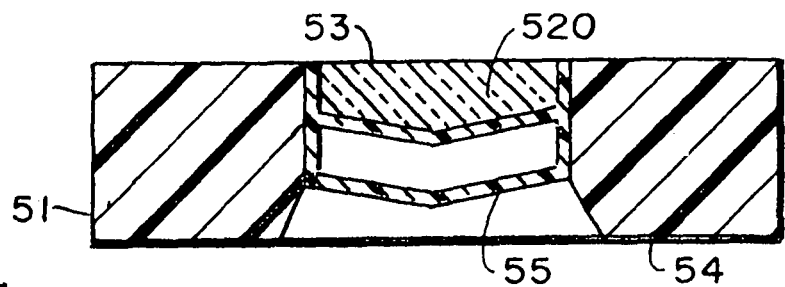
Figure 5H:
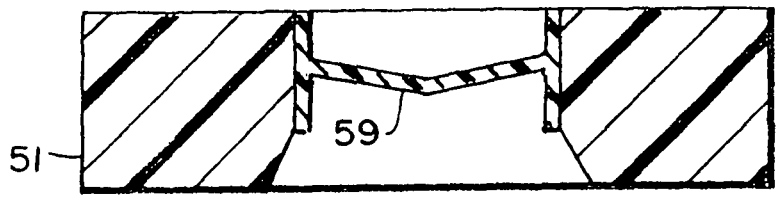

The deposition of the second etch resistant layer 520 and transparent material 53 is shown in FIG. 5g. A planarization step (not shown) may be used to produce a planar surface at the top of via 50, but may not be needed because of the use of an optical underfill. The back side 54 of the silicon substrate 51 is then etched to open the bottom side 55 of via 50. This etch may be a dry or wet etch, and must stop on the etch stop layer 52 at the base of via 50 as shown in FIG. 5g. Etch resistant layer 52 is then removed via a selective etch process, and the sacrificial layer 58 is removed. The process to remove sacrificial layer 58 may be wet (e.g. chemical etch or dissolution) or dry (e.g. plasma ashing or laser ablation). The surface remaining at the base of via 50 has the appropriate curvature and placement to be used as a lensing element. The curved surface formed by meniscus 59 acts as a lens.

Figure 5I:
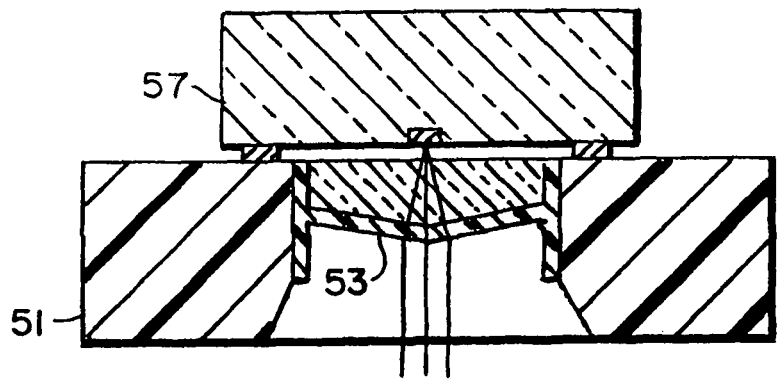

An optical communication device 57 is then aligned and attached on top of the vertical guide optical via as shown in FIG. 5i. The embodiments shown in FIG. 5e and FIG. 5i may be employed when it is desired to guide or couple optical signal of suitable wavelength from one side of silicon substrate to the other by unguided transmission through a transparent media in the silicon substrate to lens within the via.

Figure 6A:
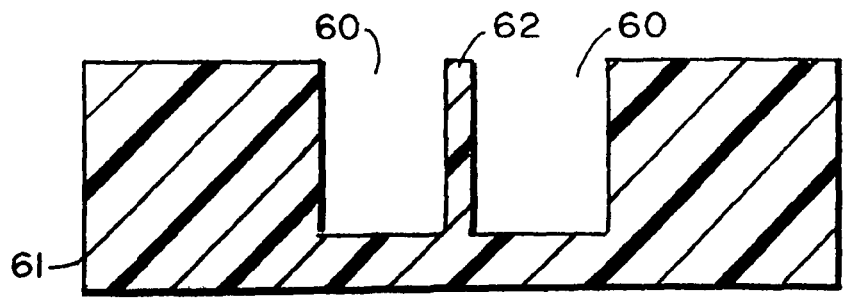
FIGS. 6a-6d are sectional side views of an alternate embodiment showing process steps to fabricate vertical channel guide optical via with a discrete index gradient guiding pillar.
Figure 6B:
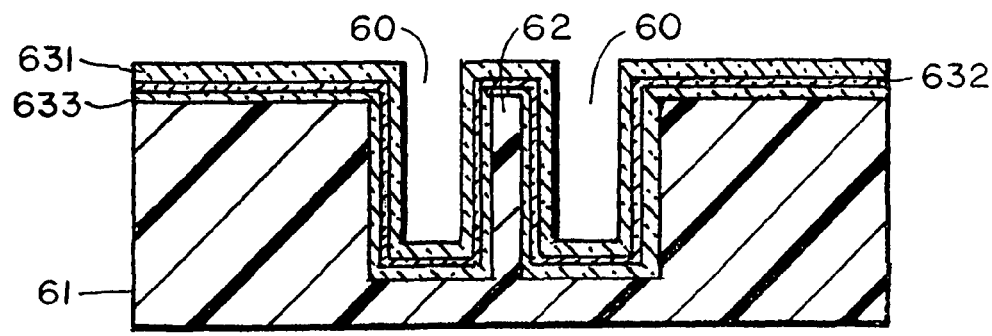
Figure 6C:
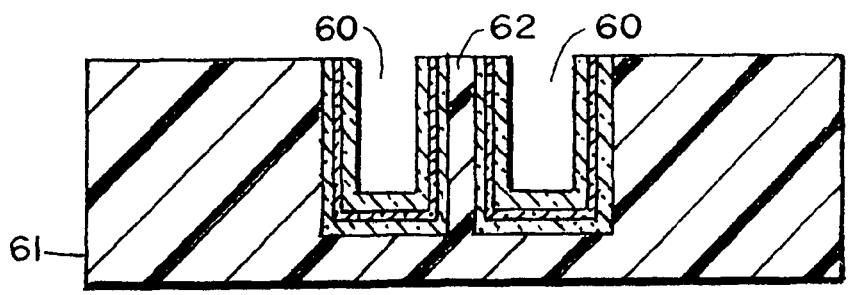
Figure 6D:
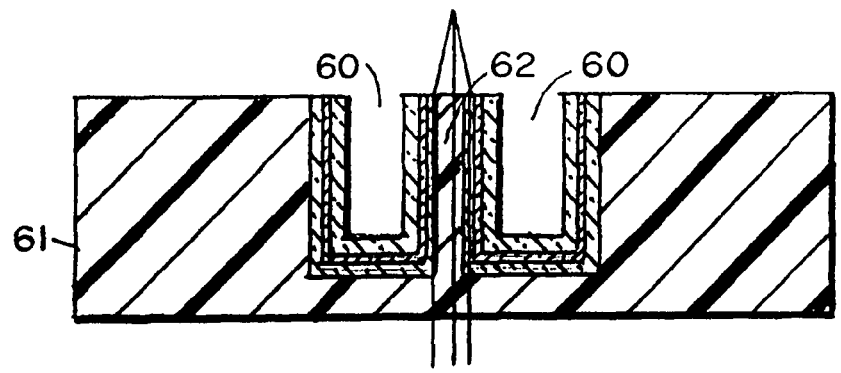
Figure 7A:
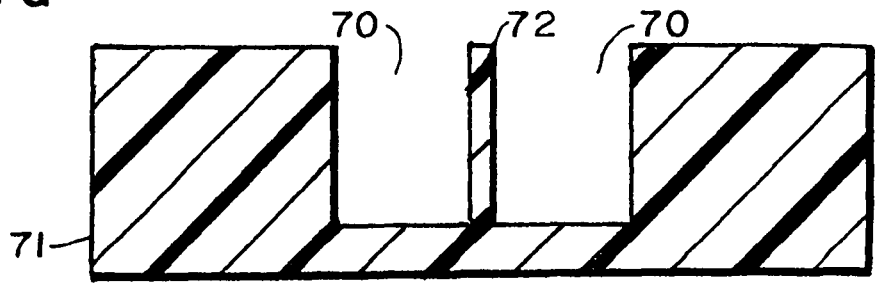
FIGS. 7a-7f are sectional side views of an alternate embodiment showing process steps to fabricate vertical channel guide optical via with discrete index gradient layers on a support pillar.
Figure 7B:
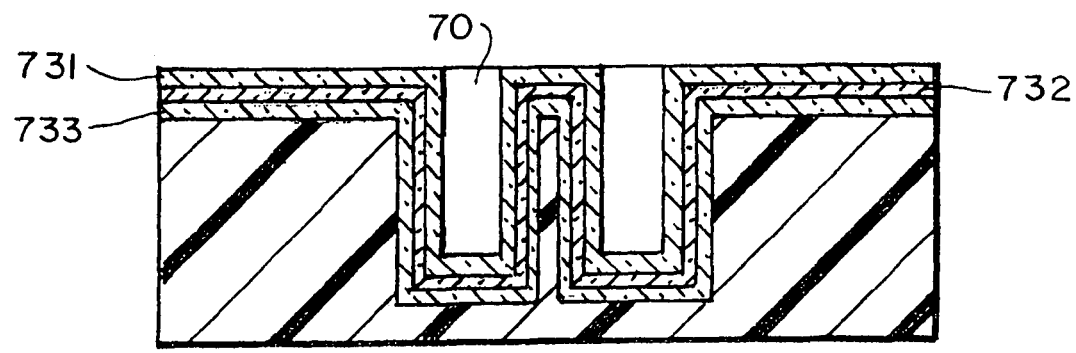

FIGS. 6a-6d are sectional side views of an alternate embodiment showing process steps to fabricate a vertical channel guide optical via through a discrete index gradient guiding pillar. Annular via 60 may be etched in a silicon substrate as shown in FIG. 6a. The annular via is formed with a small diameter silicon post 62 in its center surrounded by a large annulus of desired dimensions. The annular via 60 may be partially etched into silicon. A series of layers 631, 632, 633, etc. are sequentially deposited with decreasing refractive index producing a radially decreasing index gradient as shown in FIG. 6b. Silicon oxynitride is appropriate for use to form these layers because of the ability to control the index of the deposited layer over a wide index range from 1.45 to 2.0. Various polymers such as polyimide or siloxane polymers or vapor deposited polymers can also be used. The layers are deposited sequentially with each layer having a decreasing index until the diameter is sufficiently large to capture all of the light generated later during use. When the desired radial dimension of the pillar is attained the remaining open regions may be filled with lower index material 60' or left open for use as an electrical through via connection. The top layer may be planarized using conventional chemical mechanical polishing tools easily available in most silicon processing lines as shown in FIG. 6c if needed. FIG. 6d demonstrates how light will be guided through via 60'. The diameter of silicon post 62 should be less than or approximately equal to the projected diameter of the light guided. The intent of this embodiment is to use the small diameter silicon pillar 62 to guide the light to the base of the via using the radial index gradient in these deposited layers to assist in guiding the light, and to control the size of the beam as it passes though the optical via in the silicon substrate. This inherently assumes that the light must be of a wavelength capable of being transmitted through the silicon substrate FIGS. 7a-7f are sectional side views of an alternate embodiment showing process steps to fabricate vertical channel guide optical via thru a discrete index gradient support pillar. Annular via 70 may be etched in a silicon substrate 7l as shown in FIG. 7a. The annular via is formed with a small diameter silicon post 72 in its center surrounded by a large annulus of desired dimensions. Annular via 70 may be partially etched into the silicon substrate 71. A series of layers 731, 732, 733, etc. are sequentially deposited with decreasing refractive index producing a radially symmetric index profile gradient as shown in FIG. 7b. In this instance, layers are deposited sequentially until the diameter of the via is large enough to capture all of the light which is focused on it. One possible index profile is shown in FIG. 7f.

Silicon oxynitride is appropriate for use in these layers because of the ability to control the index of the deposited layer over a wide index range of from about 1.45 to about 2.0. Various polymers such as polyimide or siloxane polymers or vapor deposited polymers can also be used. The layers are deposited sequentially with each layer having a decreasing index until the diameter is sufficiently large to capture all of the light generated later during use. A thick silicon dioxide layer may be thermally grown or vapor deposited as the first layer prior to sequentially depositing layers 731, 732, 733, etc. from silicon pillar 72. When the desired radial dimension of the support pillar and guiding layers is attained, the remaining open regions are filled with material 70' having a low refractive index.

Figure 7C:
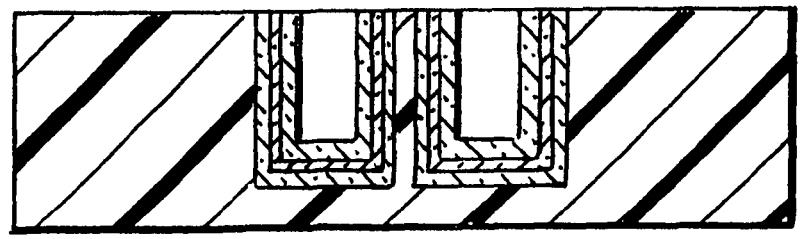
Figure 7D:
Figure 7E:
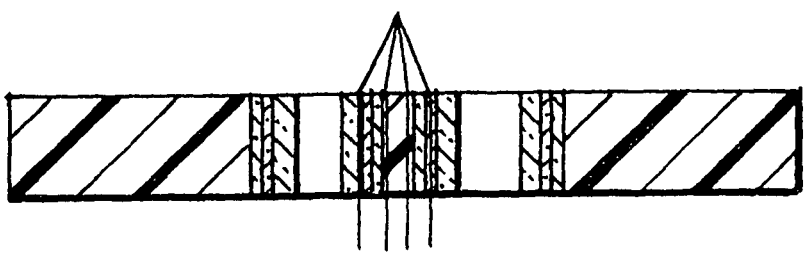
Figure 7F:
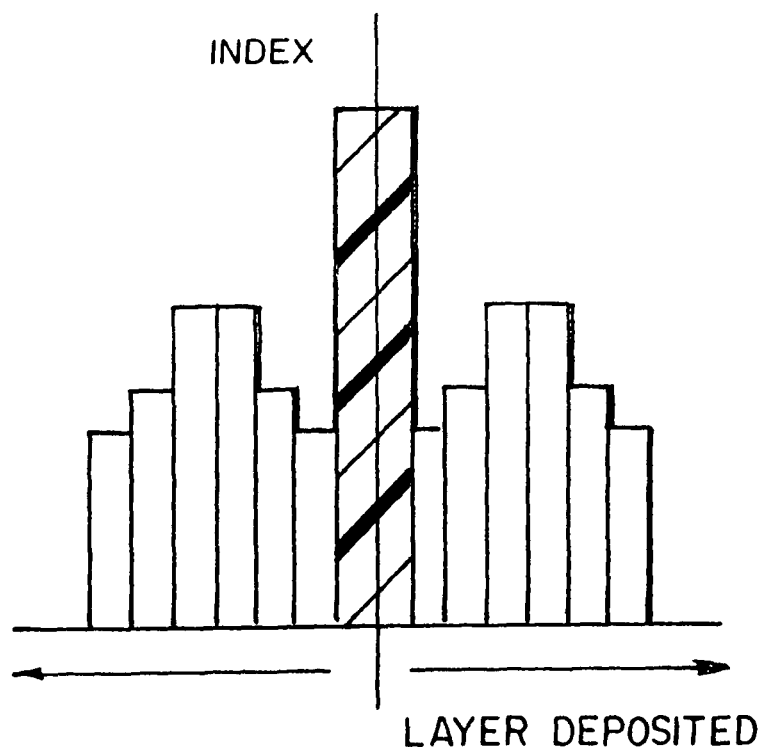

The top layer may be planarized using conventional chemical mechanical polishing tools easily available in most silicon processing lines as shown in FIG. 7c if needed. The bottom of the silicon substrate is planarized as shown in FIG. 7d. Planarization etch stop layers may be incorporated in the sequential build to assist planarization. FIG. 7e demonstrates how light will be guided through the via. The diameter of the silicon post should be much less than to the projected diameter of the light guided. The intent of this embodiment is to use this small diameter silicon pillar to support the subsequent layers that are used for guiding the light. This optical via structure is appropriate for use with many wavelengths, even <1 μm, as the light is guided around the silicon pillar and not through the pillar and is therefore not limited by the absorption of light in the material of the pillar. The intent is to minimize the contribution of the silicon pillar to the cross sectional area of the via that the light interacts with and in that way the light is guided by the index layers around the pillar.

One possible index profile is shown in FIG. 7f, where the index varies radially by deposition of discrete layers. The center silicon pillar in this figure has a relatively high index value approximately equal to 3.5, whereas the radially surrounding layers have a relatively lower index. For example, the index of the surrounding layers may vary from 1.3 to 2.0 based on the materials chosen and optimal index profile.

Though not exclusively mentioned in these embodiments, electrical wiring levels may be built on the silicon substrate prior to attaching any optical devices. Other form of electrical devices such as ICs, passive devices, or other devices may also be attached on the silicon substrate and interconnected by use of the wiring levels on the substrate. Additionally, the via structures described above may be formed from the top or the bottom side of the silicon substrate, implying the ability to make such structure in both orientations to light transmitting and receiving surfaces.

Figure 8:
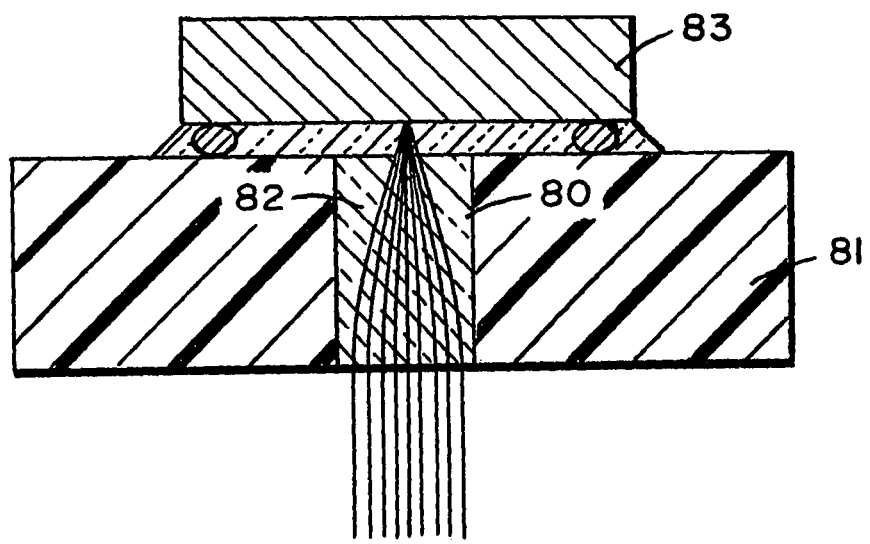
FIG. 8 is a sectional view of an alternate embodiment showing an embedded gradient index microlens.

FIG. 8 shows a cross sectional view of an alternate embodiment showing an integrated gradient index optical via. In this embodiment a thru via 80 in a silicon substrate 81 is filled with a material 82 or set of materials whose indexes gradually vary to give a microlens structure as shown in FIG. 8. Such via may have the highest index at the via center and gradually decreasing index radially outward from the center of via. This axial radial gradient may take on various forms. As an example, for the case where it is desired to collimate the light from a VCSEL 83, an axial radial gradient described by the following equation may be used.

$$n(r)=n_0+nr1r^2$$

where the center index $n_0$=1.54, the gradient parameter $nr1$=−10, and where the radius r=0 to 0.125 mm. By changing the nature of the radial gradient it is also possible to focus the light from a VCSEL directly into a waveguide structure.

The structure embodied in FIG. 8 is fabricated by first etching a thru via 80 in the silicon substrate 81. Via 80 is then filled with an optically transparent medium 82 such as a sol-gel material. Through the process of material densification, using for example a focused laser beam, the index of the transparent medium may be altered to obtain the desired radial index profile within the via. Alternatively, the transparent optical medium's index may be altered by means of ion diffusion techniques.

Figure 9:
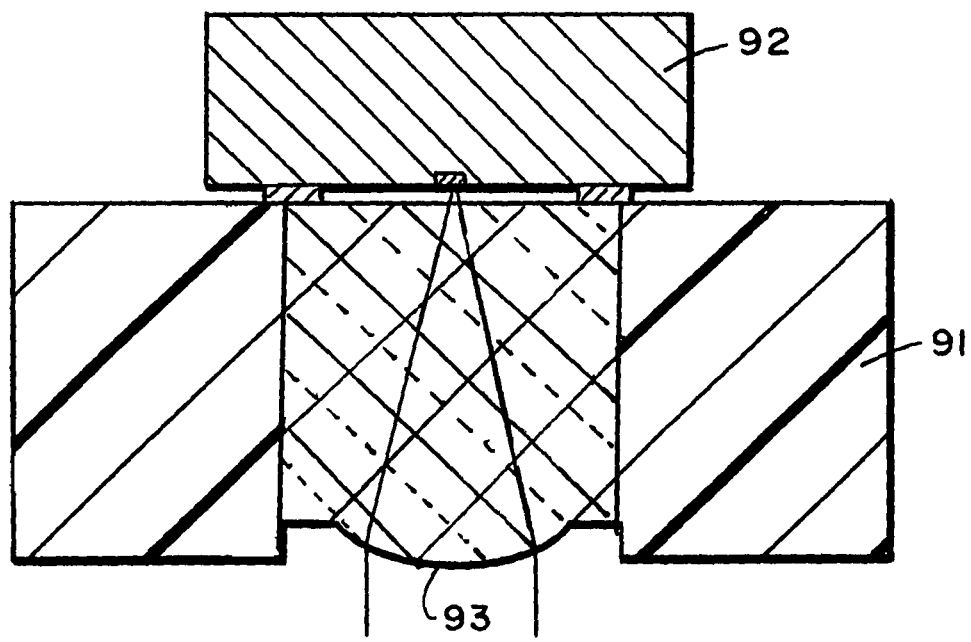
FIG. 9 is a sectional view of an alternate embodiment showing a microlens etched in to the backside of the semiconductor die.

FIG. 9 shows a cross sectional view of an alternate embodiment of a semiconductor die 91 with a microlens formed on its surface. In this embodiment a spherical or aspherical lens is formed or etched into one side or both sides of the silicon or semiconductor die 91. Silicon is essentially transparent for wavelengths greater than 1 micron. As shown, the VCSEL 92 and or photodiode may be mounted one side of the silicon substrate and the microlens 93 formed on the other.

As an example, for a 1.3 micron wavelength VCSEL, with a VCSEL to microlens distance of 500 microns, and with a microlens radius of 360 microns the light from the VCSEL is approximately collimated by the microlens.

The microlens may be fabricated by standard semiconductor fabrication means. For example a gray scale mask may be used to expose a layer of photoresisit on the Si substrate, followed by a RIE process to define the microlens surface.

Figure 10A:
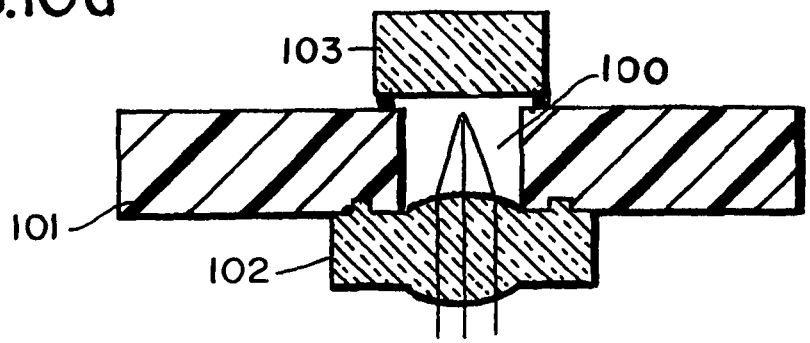
FIGS. 10a-10e are sectional views of an alternate embodiment showing attached microlenses.
Figure 10B:
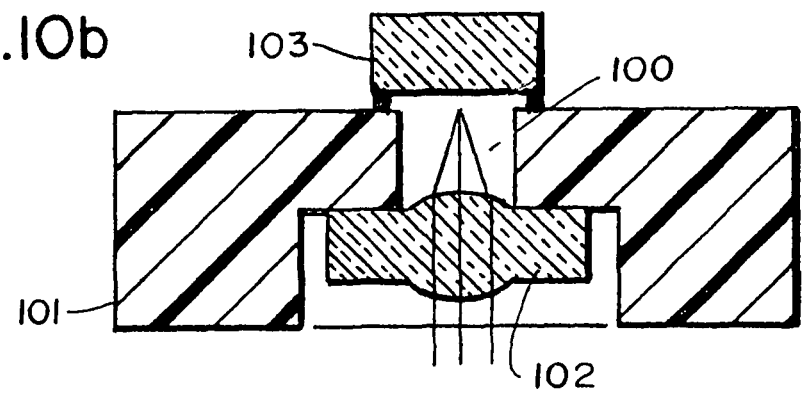
Figure 10C:
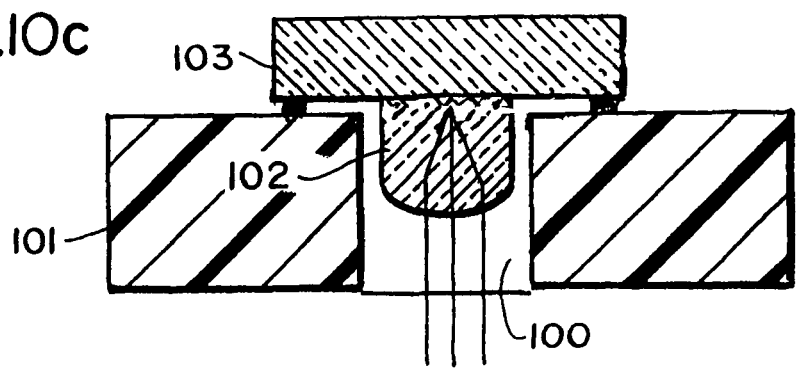
Figure 10D:
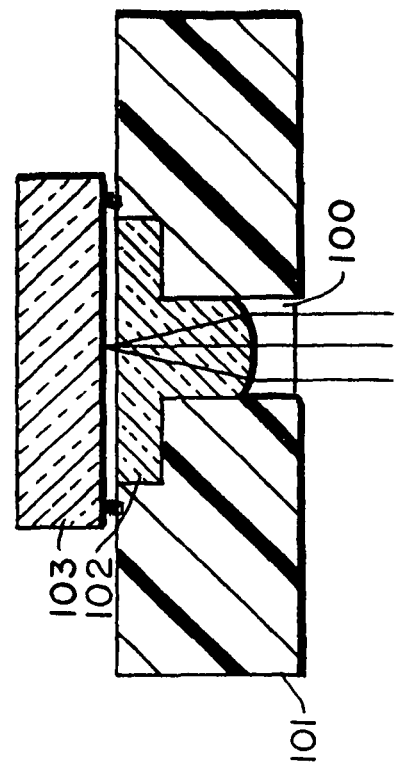
Figure 10E:
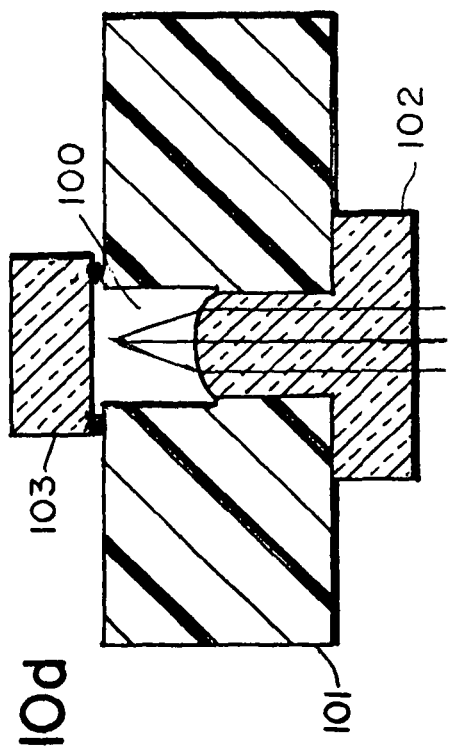

FIGS. 10a-10e show cross sectional views of an alternate embodiment of a semiconductor die with attached microlenses. In FIG. 10a a through via 100 is etched in the silicon substrate 101 and a microlens array 102 is attached in order to collimate or focus the light from the VCSEL array 103. In FIG. 10b the microlens array 102 is recessed within silicon substrate 101. In FIG. 10c the microlens array 102 is attached directly to the VCSEL 103 or photodiode array and then inserted into the silicon substrate 101 thru via 100. In FIG. 10d microlens array 102 is inserted into the through via 100 and is held in position by the via. In FIG. 10e the microlens array 102 is inserted from the top into the through via 100.

In all of these embodiments, the objective is to take advantage of the precision of the silicon etch process and define feature (such as the thru via) to which the attached microlens array may be referenced. By having these highly accurate reference features the microlens array may be simply and accurately attached to the silicon substrate in a passive manner, leading to a highly accurate, low cost assembly.

Figure 11A:
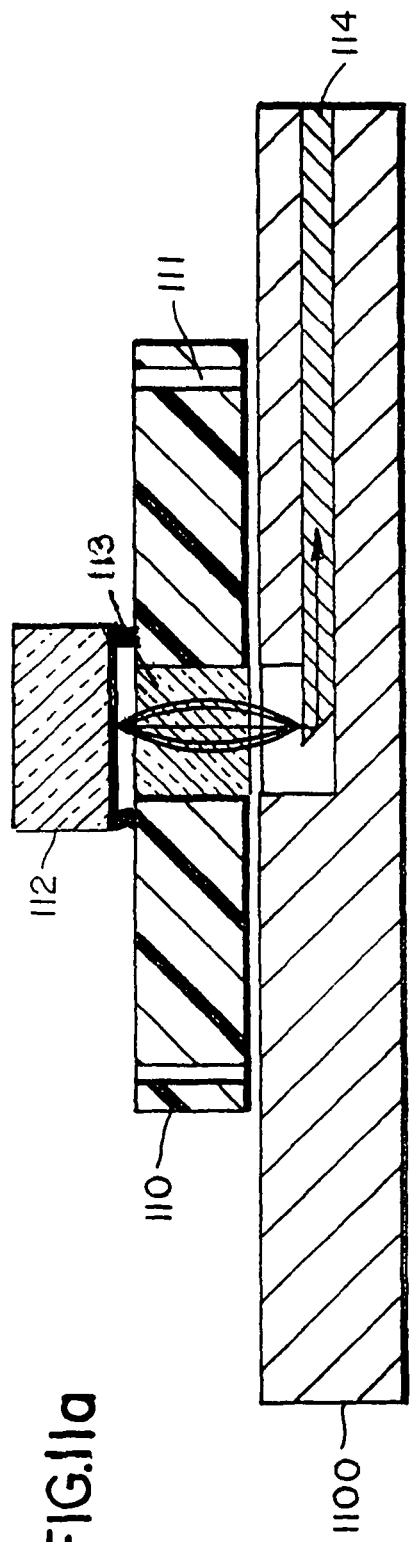
FIGS. 11a-11c illustrates the use of an electro-optical module attached to a print circuit.
Figure 11B:
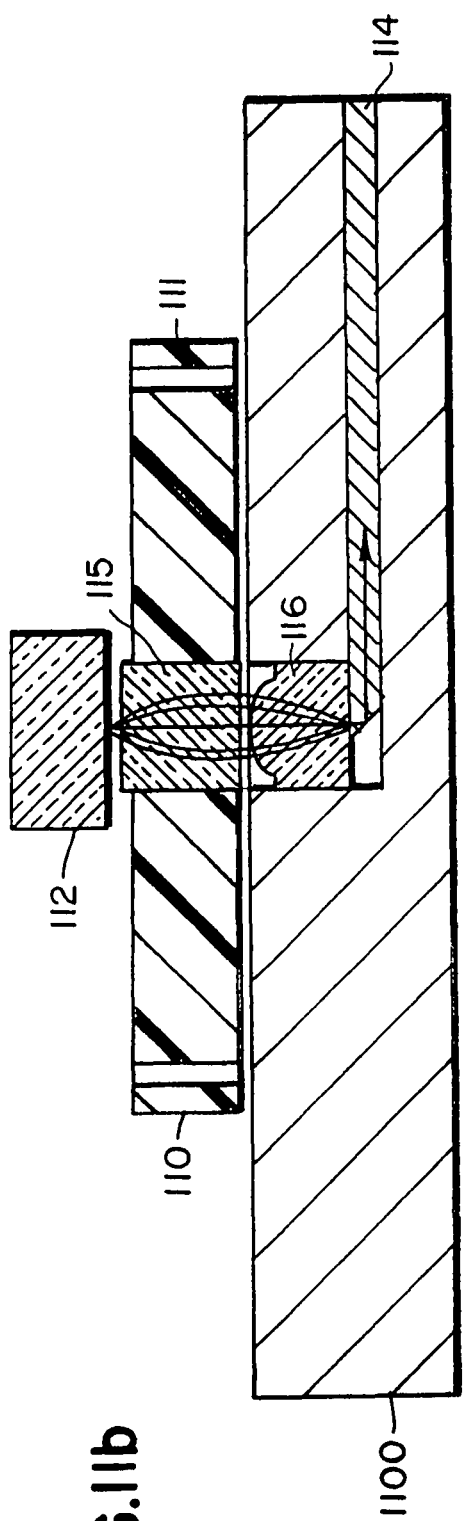
Figure 11C:
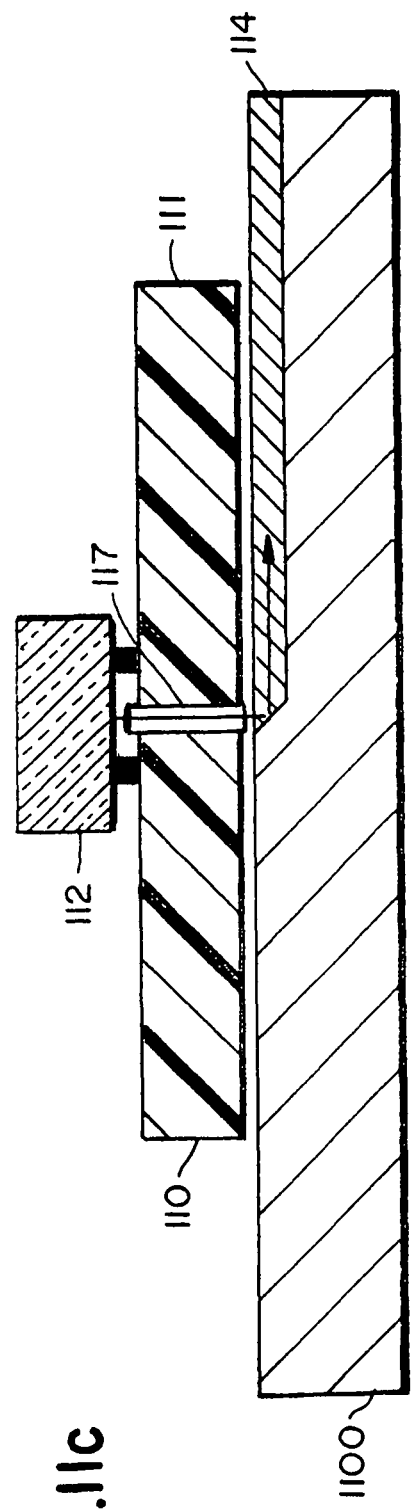

FIGS. 11a-11c illustrate how the silicon carrier electro-optic module may be used in a system. In FIG. 11a electrical signals in the printed circuit board 1100 approach the silicon carrier 111. These signals proceed through the electrical vias 110 to the top side of silicon carrier 111. Wiring on the top of the carrier conducts these signals to a VCSEL array 112. These electrical signals are then transposed by the VCSEL array into optical signals. Light from VCSEL array 112 is then focused by the microlens array 113 towards a waveguide structure 114 that is embedded in printed circuit board 1100.

Waveguide structure 114 then channels this light across printed circuit board 1100 to a receiving electro-optic module to be converted back to electrical signaling. The receiving electro-optical has a similar structure as that shown with a phototdetector (PD) in place of the VCSEL. The optical via in embodiments 1 through 10 herein in the electro-optical module fabricated in silicon performs the critical function of conveying the light energy from VCSEL 112 to the waveguide structure 114 to a photodetector on a silimar electro-optical module.

In FIG. 11*b* an alternate configuration is shown in which the microlens in the electro-optic module collimates the light. A complementary microlens array is embedded in the printed circuit board and focuses the light into the waveguide structure.

In FIG. 11*c* an alternate configuration is shown in which an optical via 110 conducts the light from VCSEL 112 through the carrier substrate 111 and directly couples the light into a waveguide structure 114. For this coupling to be efficient the optical via 110 and waveguide structure 114 shall be in intimate contact.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What we claim and desire to protect by Letters Patent is:

1. An optoelectronic system suitable for coupling optical communication means between a first side of a substrate to a second side of a substrate by means of a vertical guide optical via comprising:
   a substrate having a top surface and a bottom surface,
   a via extending vertically from said top surface substantially to said bottom surface,
   said vertical optical channel guide via having a center post, constructed out of the material forming said substrate, surrounded by an annulus forming an annular via having a volume of desired dimension, a bottom of said via extending radially outward from said center post to intersect said sidewalls;
   said via is covered with a layer of low refractive index material
   said via with said low refractive index material on said sidewalls being substantially or fully filled with a material.

2. The optoelectronic system defined in claim 1 wherein said substrate is selected from the group consisting of silicon, germanium, indium phosphide, silicon/germanium, gallium arsenide, glass, quartz, sapphire and silicon carbide.

3. The optoelectronic system defined in claim 2 wherein said centerpost is capable of transmitting optical signals.

4. The optoelectronic system defined in claim 2 wherein said centerpost is incapable of transmitting optical signals.

5. The optoelectronic system defined in claim 3 wherein said centerpost is coated with a low refractive index material.

6. The optoelectronic system defined in claim 3 wherein said sidewalls and a portion of said top of said substrate abutting said sidewalls is coated with an electrically conductive material.

7. The optoelectronic system defined in claim 3 wherein an electrically conductive connection means extends from said bottom surface of said substrate through said substrate to said electrically conductive material covering said sidewalls.

8. The optoelectronic system defined in claim 3 wherein an electrically conductive connection means extends from said bottom surface of said substrate through said substrate to said electrically conductive material covering said sidewalls, and wherein said sidewalls and a portion of said top of said substrate abutting said sidewalls is coated with an electrically conductive material.

9. The optoelectronic system defined in claim 8 wherein said layer covering said sidewalls and center post is a cladding layer formed from silicon dioxide or a polymer selected from the group consisting of acrylate polymers, siloxane polymers and vapor deposited polymer layers.

10. The optoelectronic system defined in claim 8 wherein said electrically conductive connection means is any material suitable for forming an electrical connection.

11. The optoelectronic system defined in claim 10 wherein said electrically conductive connection means is connected to a foreign substrate with complimentary electrically conductive signal lines.

12. The optoelectronic system defined in claim 11 wherein said foreign substrate is selected from the group consisting of a circuit board, a silicon substrate and a ceramic substrate.

13. The optoelectronic system defined in claim 11 wherein said substrate is selected from the group consisting of silicon, germanium, indium phosphide, silicon/germanium, gallium arsenide, glass, quartz, sapphire and silicon carbide.

14. The optoelectronic system defined in claim 13 wherein said transparent material has low optical attenuation.

15. The optoelectronic system defined in claim 14 wherein said material having low optical attenuation is a polymer selected from the group consisting of acrylate or siloxane polymers.

16. The optoelectronic system defined in claim 13 wherein said optical directing elements are selected from the group consisting of refractive or diffractive means.

17. The optoelectronic system defined in claim 16 wherein said optical directing means are refractive means.

18. The optoelectronic system defined in claim 17 wherein said refractive means is a lens.

19. The optoelectronic system defined in claim 16 wherein said optical directing means are diffractive means.

20. The optoelectronic system defined in claim 19 wherein said diffractive means is a grating.

21. The optoelectronic system defined in claim 8 wherein said electrically conductive connection means is selected from the group consisting of solder and a conductive adhesive.

22. The optoelectronic system defined in claim 3 wherein said volume of said annular via is fully or partially filled with said high refractive index material, and all or a portion of said remaining volume is filled with a material selected from the group consisting of an optical, electrical or dielectric filler material.

23. The optoelectronic system defined in claim 22 wherein said optical material filling said volume is an optically transparent polymer.

24. The optoelectronic system defined in claim 23 wherein said optically transparent polymer is selected from the group consisting of acrylates and siloxanes.

25. The optoelectronic system defined in claim 22 wherein said electrical material filling said volume is conductive copper paste.

26. The optoelectronic system defined in claim 25 wherein said light receiving elements are selected from the group consisting of a photodetector, photoreceiver, optical fiber or waveguide.

27. The optoelectronic system defined in claim 26 wherein said light receiving element is a photodetector.

28. The optoelectronic system defined in claim 22 wherein said dielectric filler material is a dielectric polymer.

29. The optoelectronic system defined in claim 28 wherein said dielectric polymer is selected from the group consisting of epoxy or polyimide.

30. The optoelectronic system defined in claim 22 wherein said dielectric filler material is selected from the group consisting of inorganic dielectrics spun on glass.

31. The optoelectronic system defined in claim 3 wherein said light transmitting elements are selected from the group consisting of light emitting carbon nanotube, vertical cavity surface emitting laser (VCSEL), light emitting diode (LED), edge emitting laser, external source, wave guiding element and optical fiber means.

32. The optoelectronic system defined in claim 31 wherein said light transmitting element is a vertical cavity surface emitting laser (VCSEL).

33. An optoelectronic system comprising the coupling optical communication means between a first side of a substrate to a second side of a substrate by means of a vertical guide optical via, said system having:
 a substrate having a top surface and a bottom surface,
 a through via extending vertically from said top surface to said bottom surface of said substrate,
 said via being fully filled with a transparent material having a top surface and a bottom surface,
 said bottom of said transparent material configured to form optical light directing elements,
 light emitting and receiving elements aligned to said vertical guide optical via.

34. An optoelectronic system comprising the coupling optical communication means between a first side of a substrate to a second side of a substrate by means of a vertical guide optical via, said system having:
 a substrate having a top surface and a bottom surface;
 a via partially extending vertically from said top surface toward said bottom surface;
 said via having a center post surrounded by an annulus forming an annular via having sidewalls and a base defining a volume of desired dimension;
 a plurality of layers extending radially outward from said center post, comprising an annular first layer which contacts said center post, and successive layers, each said layer possesses a refractive index higher than the contiguous layer preceding it up to a maximum refractive index value for a layer, and an equal number of layers of decreasing refractive indices, the gradient refractive index values of the layers up to the maximum refractive index being the inverse the layers of decreasing refractive indices;
 light emitting and receiving elements aligned to said vertical guide optical via.

35. The optoelectronic system defined in claim 34 wherein said layers have an index in the range of 1.45 to 2.0.

36. The optoelectronic system defined in claim 35 wherein said via is partially filled with a transparent material having a top surface and a bottom surface, and said bottom of said transparent material configured to form a lens with a curved surface.

37. The optoelectronic system defined in claim 35 wherein said layers are selected from the group consisting of silicon dioxide, silicon oxynitride, polyimide, vapor deposited polymers and polysiloxane.

38. The optoelectronic system defined in claim 37 wherein said center post is a silicon pillar coated with silicon dioxide as the first layer thereon to optically isolate light transmitted in said layers from said pillar.

39. The optoelectronic system defined in claim 35 wherein the diameter of said silicon pillar is less than the diameter of light beam guided through said center.

40. An optoelectronic system comprising the coupling of optical communication means between a first side of a substrate to a second side of a substrate by means of a vertical guide optical via, said system having:
 a substrate having a top surface and a bottom surface;
 a through via extending vertically from said top surface to said bottom surface;
 a microlens array in alignment with said via;
 light emitting and receiving elements aligned to said vertical guide optical via.

41. The optoelectronic system defined in claim 40 wherein said microlens is situated within said via in said substrate.

42. The optoelectronic system defined in claim 40 wherein said microlens is situated partially within said via in said substrate.

43. The optoelectronic system defined in claim 40 wherein said microlens is situated outside said via in said substrate.

44. An optoelectronic system suitable for coupling optical communication means between a first side of a substrate to a second side of a substrate by means of a vertical guide optical via comprising:
 a silicon substrate wafer having a top surface and a bottom surface;
 a through vertical cylindrical via extending vertically from said top surface to said bottom surface of said silicon substrate wafer;
 said through vertical cylindrical via having sidewalls covered with a layer of low refractive index material comprising a silicon dioxide cladding layer;
 said vertical cylindrical via comprising said silicon dioxide cladding layer having a refractive index of 1.5 on said sidewalls being substantially filled with a center post constructed from a silicon dioxide material having a refractive index of 2.0;
 and the difference in refractive indices between said high index of refraction of said silicon dioxide center post material and said low index of refraction of said silicon dioxide cladding layer being 0.5;
 a vertical cavity surface emitting laser light emitting and receiving source aligned to said vertical guide optical via.

* * * * *